United States Patent [19]

Götze et al.

[11] Patent Number: 4,468,735
[45] Date of Patent: Aug. 28, 1984

[54] HIGHLY INTEGRATED PROGRAMMABLE LOGIC ARRAY UTILIZING AND AND OR ARRAYS

[75] Inventors: Volkmar Götze, Grafenau; Günther Potz, Sindelfingen, both of Fed. Rep. of Germany

[73] Assignee: International Business Machines Corporation, Armonk, N.Y.

[21] Appl. No.: 378,959

[22] Filed: May 17, 1982

[30] Foreign Application Priority Data

May 30, 1981 [DE] Fed. Rep. of Germany ....... 3121562

[51] Int. Cl.³ .............................................. G06F 7/00
[52] U.S. Cl. ................................................. 364/200
[58] Field of Search ...................... 364/716, 200, 900; 307/200 B, 465, 468; 365/94, 177, 189

[56] References Cited

U.S. PATENT DOCUMENTS

| | | | |
|---|---|---|---|
| 3,987,286 | 10/1976 | Muehldorf | 235/125 |
| 4,053,793 | 10/1977 | Ernst et al. | 307/465 |
| 4,084,152 | 4/1978 | Long et al. | 340/166 R |
| 4,103,182 | 7/1978 | Bradley | 307/465 |
| 4,177,452 | 12/1979 | Balasubramanian et al. | 340/166 R |
| 4,195,352 | 3/1980 | Tu et al. | 307/468 |
| 4,208,728 | 6/1980 | Blahut et al. | 365/154 |
| 4,233,667 | 11/1980 | Devine et al. | 307/465 |
| 4,237,542 | 12/1980 | Cukier | 364/900 |
| 4,293,783 | 10/1981 | Patil | 307/465 |
| 4,354,228 | 10/1982 | Moore et al. | 364/200 |

OTHER PUBLICATIONS

*IBM Technical Disclosure Bulletin*, vol. 20, No. 10, Mar. 1978, "Increasing Chip Density by Space Sharing of Programmed Logic Arrays" by Balasubramanian et al., pp. 4016-4018.

*IBM Technical Disclosure Bulletin*, vol. 24, No. 2, Jul. 1981, "Three-Dimensional Programmable Logic Array" by Goetze et al., pp. 886-887.

MOS/LSI Design and Application, by W. Carr and J. Mize, McGraw Hill 1972, pp. 229-258.

*IBM Technical Disclosure Bulletin*, vol. 17, No. 3, Aug. 1974, pp. 811-812.

*Primary Examiner*—Gareth D. Shaw
*Assistant Examiner*—Jameson Lee
*Attorney, Agent, or Firm*—T. Rao Coca

[57] ABSTRACT

A programmable logic array (PLA) is comprised of double-personalized cells conventionally arranged in an AND and OR array. In order to activate redundant or Don't Care positions, i.e., array positions not being used for performing the respective PLA functions, control circuits are provided preceding the AND array as well as between the AND and the OR array. This allows an increase in the number of possible PLA functions to be performed by a given PLA thus providing PLA's with improved functional density. The control circuits essentially consist of two-stage AND-OR circuits being fully compatible with the AND and OR array technology of the PLA. For optimum utilization of the Don't Care positions and planes, each functional input can be switched to any discretionary functional line of the PLA. By providing an additional control line in the OR array, the control logic for the entire OR array is reduced to only two AND gates.

11 Claims, 6 Drawing Figures

HIGHLY INTEGRATED PROGRAMMABLE LOGIC ARRAY UTILIZING AND AND OR ARRAYS

BACKGROUND OF THE INVENTION

The invention generally relates to a programmable logic array (PLA). More particularly, the invention relates to a PLA of improved functional and physical integration density.

Programmable logic arrays are known in various forms, e.g. from the book "MOS/LSI Design and Application" by W. Carr and J. Mice, McGrau-Hill, 1972, pp. 229 to 258. By means of a progrmmable logic array, combinatorial logic can be directly implemented in regular structures, particularly in matrix arrangements. Compared with earlier logic circuits which were not provided in regular structures, PLA's facilitate mass production as well as testing and stock keeping.

Beside programmable logic arrays whose logic or data pattern is permanently impressed during production, with no subsequent modifications being possible, there also have been described programmable logic arrays permitting alteration after manufacture. U.S. Pat. No. 3,987,286 assigned to the assignee of the present invention is an example of such an arrangement. There, through time-controlled release or inhibition of logic circuits of the matrix arrangements, different logic functions can be executed in one and the same PLA. This arrangement requires, however, that personalization data must be stored in additionally required shift register elements.

Further, multi-personalizations with specific coupling and logic elements are known which can adopt several states. Reference is made in this connection to IBM Technical Disclosure Bulletin, Vol. 17, No. 3, August 1974, pp. 811 and 812. However, owing to the components, and the low operational speed these concepts were not fully satisfactory.

From IBM Technical Disclosure Bulletin, Vol. 20, No. 10, March 1978, pp. 4016 to 4018, and U.S. Pat. No. 4,084, 152, highly integrated programmable logic circuit arrays are known, where remaining unused logic areas, i.e. redundant circuits, are reduced. A disadvantage of these circuit arrangements, however, is that they impose considerable restrictions on the expert when designing complex logic networks. This means that the high amount of flexibility from regular structures is lost with the consequences that the possible application field of this type of programmable logic arrays is very limited.

In applicant's co-pending U.S. patent application, Ser. No. 317,699 filed Nov. 2, 1981 and assigned to the assignee of the present invention which is now U.S. Pat. No. 4,445,202, a further improvement of these programmable logic arrays is disclosed which permits a higher functional density as well as a rapid electrical switching between different functions while avoiding the need for high re-programming voltages or specific circuit elements. More particularly, array logic or coupling elements are one-device FET cells whose gate electrodes are patterned in accordance with a respective personalization state at that particular crosspoint. For instance, in a two-fold personalization PLA, the coupling elements consist of FET's with two gate sections provided one beside the other. For a connection to be established in only one of the two possible functions at the respective crosspoint, one of the gate sections is connected to a control line provided for the functional selection. The remaining gate section is connected to the associated input line. A connection in the other functional mode is provided correspondingly with only the control lines being switched. If at the respective crosspoint a connection is to be effective in both functional modes, both gate sectiions are jointly connected to the respective input line. Although this type of a PLA offers a high semiconductor surface utilization and is therefore suitable for highly integrated structures, it is still desirable to take advantage of the relatively high amount of remaining redundant components or Don't Care positions in such a PLA structure.

Accordingly, it is an object of the invention to provide a programmable logic array with a further increased functional density.

It is another object of this invention to provide a programmable logic array with a quick electrical switching capability between different stored functions without a need for high voltages or special cell components for re-programming.

Yet another object of the invention is to provide in a highly integrated programmable logic array the activation of available redundant or Don't Care states of array cells.

SUMMARY OF THE INVENTION

In accordance with the invention a programmable logic array is comprised of double-personalized cells arranged in an AND and OR array. In order to activate otherwise redundant or Don't Care positions, control circuits are provided preceding the AND array as well as between the AND and the OR array. These control circuits consist of two-stage AND-OR circuits. For optimum utilization of the Don't Care positions and planes, each functional input can be switched to any discretionary functional line of the PLA. By providing an additional control line in the OR array, the control logic for the entire OR array can be reduced to only two AND circuits.

Owing to the activation of the Don't Care state of the cells within the PLA and the separate control means for the AND and the OR array of the PLA, there now exists a considerably increased number of accessible logic functions, which goes along with a significant reduction of circuit redundancy.

Through the newly introduced control circuits in the form of two-stage AND/OR circuits, an elegant control of the AND and OR arrays has become possible. Such a type of control circuit fits very well into the entire structure of the programmable logic array in highly integrated technique. The additional circuit space required for the control logic can thus be kept at a minimum.

BRIEF DESCRIPTION OF THE DRAWINGS

The foregoing and other objects, features and advantages of the invention will be described with reference to the drawings which illustrate a preferred embodiment. In the drawings.

DETAILED DESCRIPTION OF THE INVENTION

Figure 1:
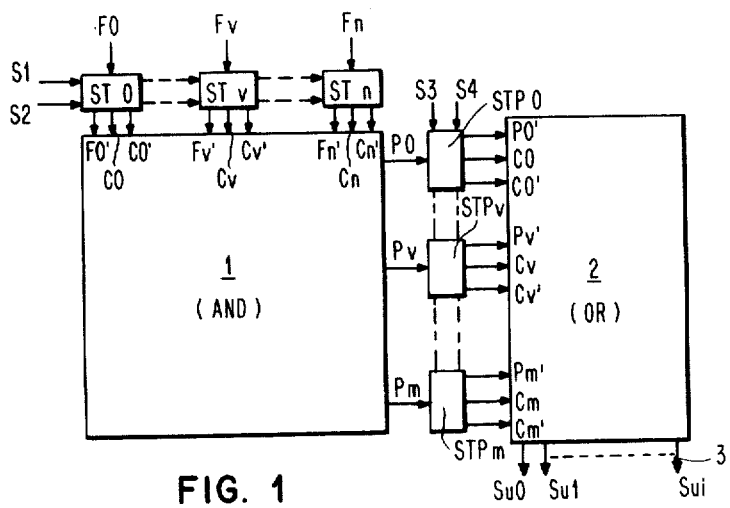
FIG. 1 is a block circuit diagram of a programmable logic array which in accordance with the invention is provided with control circuits arranged at the inputs of the AND array and between the AND and OR arrays.

The programmable logic circuit array of FIG. 1 is particularly suitable for being made in a highly integrated mode, since it has a regular structure, and since the interposed control circuits also consist of a combination of AND and OR circuits. This programmable logic circuit array is comprised of an AND array 1 and an OR array 2. Control circuits STo to STn are provided preceding AND array 1 for selecting one of the possible cells. To each of the control circuits STo to STn control inputs S1 and S2 are jointly applied, as well as one respective functional input F0, F1, ... Fn. The outputs of each control circuit STo to STn are marked F0', C0, C0', ..., Fn', Cn, Cn'. This circuit for selecting one of the five possible states within the programmable logic array is to satisfy the following conditions for each functional line (with index v running from 0, 1, 2 ... to n for AND array 1):

TABLE 1

| Control Inputs | | | PLA Inputs | | |
|---|---|---|---|---|---|
| S1 | S2 | PLA Function | Fv' | Cv | Cv' |
| 1 | 0 | FKT1 | Fv | 1 | 0 |
| 0 | 0 | FKT2 | Fv | 0 | 1 |
| 0 | 1 | FKT3 | 0 | Fv | Fv |

Fv' = Fv · $\overline{S2}$
Cv = Fv · S2 + $\overline{S2}$ · S1
Cv' = Fv · S2 + $\overline{S2}$ · $\overline{S1}$ AND array 1 comprises product term (output) lines Po and Pm which act on the OR array via control circuits STPo to STPm, and their output lines P0', C0, C0', ... Pm', Cm, Cm'. Also applied to control circuits STPo to STPm are control inputs S3 and S4. At the lower edge of OR array 2, the output (sum term) lines 3 of the programmable logic array are provided. The structure of control circuits STo to STn and STPo to STPm will be described below in connection with FIG. 2.

Figure 2:
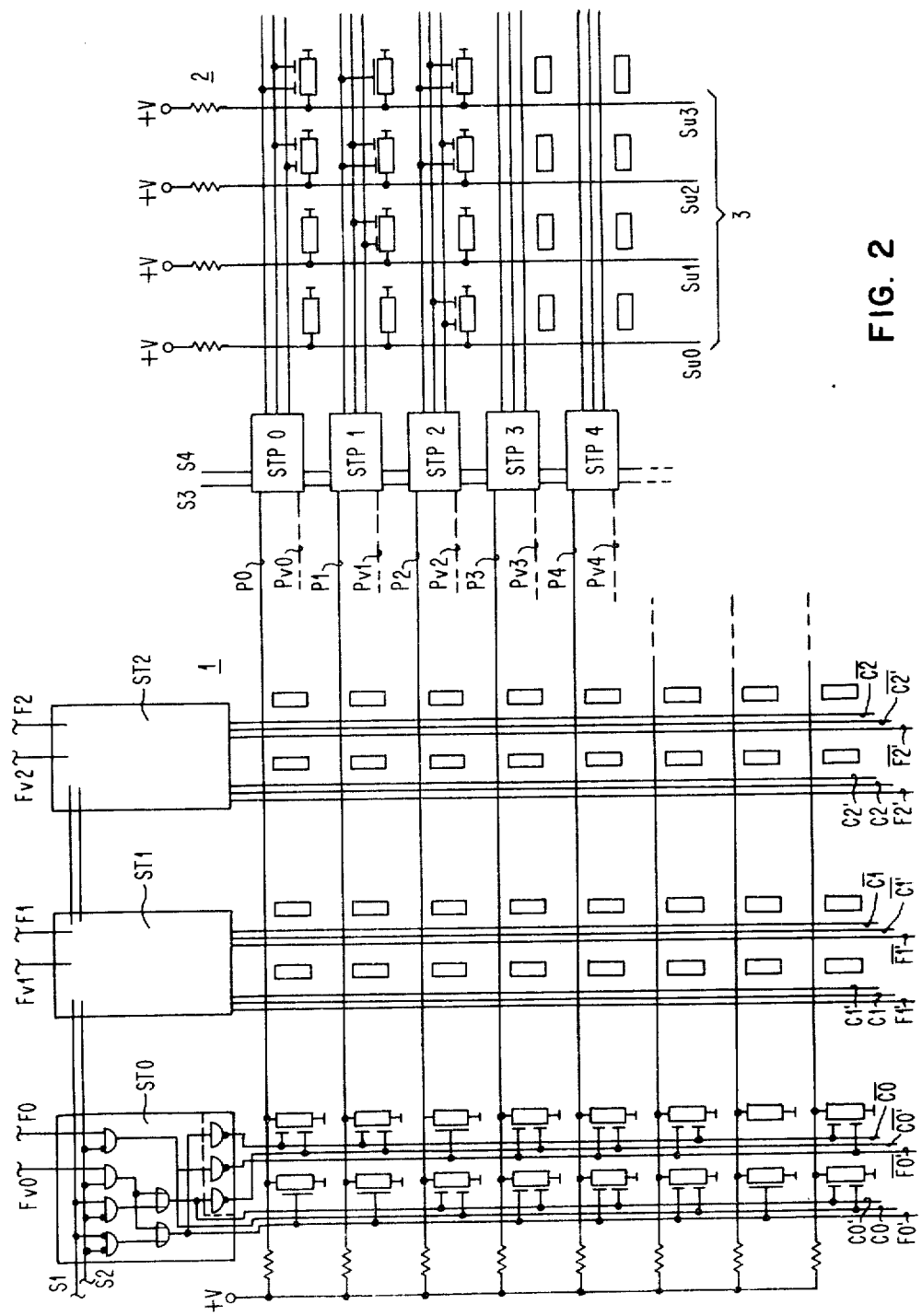
FIG. 2 shows a schematic of a PLA employing the field effect transistor technnique, the PLA cells having two gate electrodes per field effect transistor.

FIG. 2 shows a more detailed circuit diagram of a programmable logic circuit array suitable for maximum integration through the use of field effect transistors with two gate electrodes. Before describing the operation of this arrangement in detail, the structure and operation of one single cell according to FIG. 3 will be discussed. A single cell for the programmable logic circuit array described in FIG. 2 consists of a field effect transistor FET. This field effect transistor FET comprises two gate electrodes T1 and T2. One electrode of the field effect transistor FET, preferably the drain electrode, is connected via a line and a resistor R to a supply voltage V+. Further, there exist line Fv', provided vertically to this line, as well as line Cv and line Cv'. Line Fv' is the functional input line required in double personalization as indicated in Table 1 above for the two functions FKT1 and FKT2. The line connections to the two gate electrodes T1 and T2 of the respective cell FET have to correspond to this table.

Figure 3:
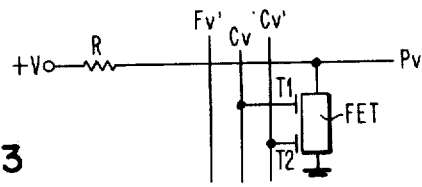
FIG. 3 shows a PLA cell with activation of a Don't Care state.

If the Don't Care state of the FET is to be activated for a third function FKT3 the connections of FIG. 3 to T1 and T2 of the respective cell FET are to be established. These connections correspond to the activation condition: Cv = Cv' = Fv.

Up to now, this additional PLA cell state had not been used in the double personalization as mentioned above in connection with applicant's application Ser. No. 317,669 which is now U.S. Pat. No. 4,445,202 which is hereby expressly incorporated by reference for further explanation of the basic multi-addressable PLA structure and operation.

Returning to FIG. 2 the representation shows particularly the practical functional realization by means of cells and their wiring in accordance with FIG. 3. In the upper part of FIG. 2, there are control circuits ST0, ST1 and ST2 connected to the common control lines S1 and S2. Inputs F0, F1, F2 ... are applied to these control circuits. For better utilization of the Don't Care positions the control circuits, e.g. STo, provide the possibility to feed in another input, e.g. Fv0 besides F0. Such a second input may be provided, for instance, by a wiring cross-connection from one of the other functional inputs Fv. In general, this allows a still higher degree of flexibility as to the assignment of the various input signals to particular control circuits of PLA input lines, respectively. If this additional degree of freedom is not needed the respective inputs, e.g. F0 and Fv0, are connected and designated F0 as generally indicated in FIG. 1. The same applies accordingly for all product terms, i.e., the input lines to control circuits STPo, STP1 ... STPm.

As shown in detail for STo the control circuits are comprised of conventional AND and OR gates. They have an identical structure for all the control circuits STo, ST1 ... STn and (with with exception of the inverter output stages) for STPo, STP1 ... STPm. In this connection it is to be noted that this type of circuit structure, i.e., AND and OR gates, is well compatible with the (FET) technology of the AND and OR arrays forming the PLA.

In the control circuit embodiment shown in FIG. 2 the input signals for AND array 1, are converted into their respective inverted forms. It should be appreciated, however, that directly applying the input signals in true and complement form is likewise possible with a corresponding circuit reduction obtainable within the control circuits. At the outputs of the control circuits, e.g. STo, signals C0 and C0' as well as F0' are available in true and complement form. At the outputs of the other control circuits ST2, ST1, etc., the corresponding signals are available, as shown in FIG. 2. These output signal lines are collected column-wise and connected to the gate electrodes of the cell FET's of AND array 1 in such a manner that each control circuit has advantageously two associated columns, i.e. one with the true function F0', and the other with the complement function F0'. The output lines of AND array 1 are represented by the horizontal lines Po to Pm, five of which are shown in FIG. 2. These horizontal lines Po to Pm are connected at their left and via one respective resistor to supply voltage +V. Lines Po to Pm lead as input lines to control circuits STPo to STPm provided between AND array 1 and OR array 2. Five control circuits are indicated schematically in FIG. 2. Control circuits STPo to STPm are controlled by control signals S3 and S4. Additional inputs Pvo ... Pvm can be connected to discretionary product term lines (Po ... Pm) for the optimum utilization of the Don't Care position as mentioned above for further input signals, e.g. Fv0 applied to control circuit STo. The output lines of control circuits STPo to STPm are connected to the gate electrodes of one respective row of cells in OR array 2. The cells of OR array 2 are also comprised of a basic cell in accordance with FIG. 3. Vertically to the output lines of control circuits STPo to STPm there extend (sum term) lines 3 providing the PLA output. At their other end these lines are connected via a respective resistor to supply voltage +V.

The control circuits ST0, ST2, etc. for selecting one of the five possible cell states have to satisfy the conditions of each functional line in accordance with the Table 1 supra. Those functions are performed by the AND and OR circuits in control circuit STo. The circuit structure for control circuits ST1 to STm is analogous thereto, as is the structure of the further control circuits STPo to STPm provided between the AND and the OR array of the programmable logic array. The latter control circuits, however, need not to incorporate the inverter output stages indicated as part of STo. For the optimum utilization of the Don't Care states of a programmable logic circuit array, each functional input can be switched to any discretionary functional line of the programmable logic circuit array.

In the following, a listing of possible functional combinations will be given. As the AND and the OR array 1 and 2 can be controlled separately, nine logic functions can be realized, as shown from the following Table 2. The theoretically possible number of 16 combinations is reduced to 9 by excluding the conditions S1=S2=1 and S3=S4=1 which is in compliance with the earlier given Table 1.

TABLE 2

| S1 | S2 | S3 | S4 | PLA Function |
|----|----|----|----|--------------|
| 1  | 0  | 1  | 0  | FKT1         |
| 0  | 0  | 0  | 0  | FKT2         |
| 0  | 1  | 0  | 1  | FKT3         |
| 1  | 0  | 0  | 0  | FKT4         |
| 0  | 0  | 0  | 1  | FKT5         |
| 0  | 1  | 1  | 0  | FKT6         |
| 1  | 0  | 0  | 1  | FKT7         |
| 0  | 0  | 1  | 0  | FKT8         |
| 0  | 1  | 0  | 0  | FKT9         |

As pointed out above, control circuits ST0 to STn and STPO to STm can easily be integrated in the structure of the programmable logic circuit array also consisting of AND and OR circuits. Consequently, the additional surface required for these control circuits is relatively small.

Figure 4A:
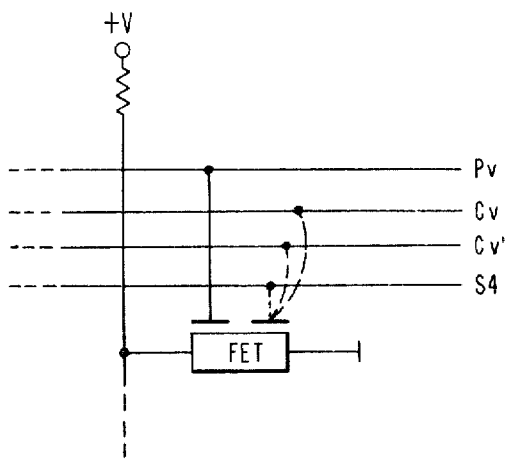
FIG. 4A shows a further embodiment for the cell selection in the OR array as an alternative to the version of FIG. 2.

Depending on the use of the programmable logic circuits, there is a difference as regards the number of inputs, the number of lines for the product terms, and the number of lines for the sum terms. In cases of a great number of product terms, the integration of an additional control line into OR array 2 is recommended. In this case any FET in the OR array can be wired with regard to its gate connections so that its selection is dependent on the occurrence of one of the signals designated (generally) Cv, Cv'or S4 as illustrated in FIG. 4A.

Figure 4B:
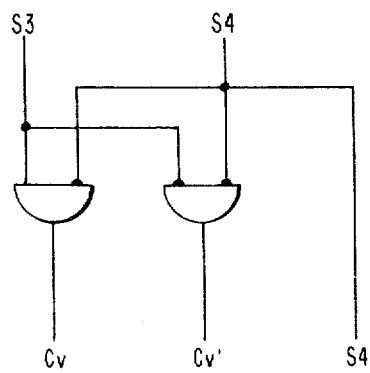
FIG. 4B shows the modified control logic for the selection type of FIG. 4A.

Thus, the control logic for the entire OR array 2 can be reduced to two logic AND circuits as depicted in FIG. 4B. As is apparent from the following Table 3 by the introduction of an additional control line (S4) in the OR array three OR array functions (A, B, C) can be selected. (The same would of course apply with respect to the AND array of the PLA, if necessary.) Thus a triple use of the array bits is possible where the third function is no longer restricted to array positions not occupied by the first and/or second conventional function personalization.

TABLE 3

| S3 | S4 | Cv | Cv' | S4 | OR Array Function |
|----|----|----|-----|----|-------------------|
| 0  | 0  | 0  | 1   | 0  | A                 |
| 0  | 1  | 0  | 0   | 1  | B                 |
| 1  | 0  | 1  | 0   | 0  | C                 |

Figure 5:
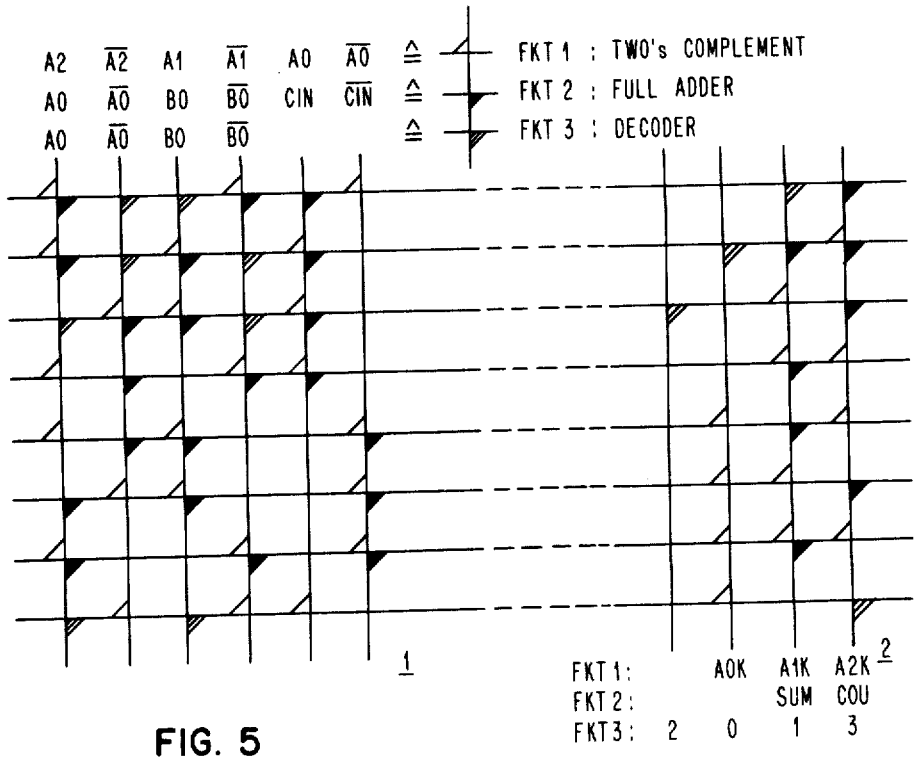
FIG. 5 shows a schematic representation of part of a programmable logic circuit array in a personalized form of a two-fold addressable PLA with three optional functions, i.e. two's complement, full adder and decoder.

FIG. 5 is a schematic representation of part of the programmable logic circuit array in a personalized form. At the left there is a schematic representation of AND array 1, and at the right of OR array 2. Instead of control circuits STP0 to STP4, and ST0 to ST4, and ST0 to ST2 as shown in FIG. 2, the logic signals supplied by these control circuits to the individual column lines in AND array 1 are illustrated.

For the AND array 1 there are shown six vertical input lines for 3 inputs provided in their respective true and inverted representation. To these input lines there are applied the input signals as indicated in FIG. 5, e.g. $A2, \overline{A2}, A1, \overline{A1}, A0, \overline{A0}$. The respective function to be performed with these signals is referred to as FKT 1, and is to produce the two's complement of a 3 digit binary number. The corresponding personalization symbol for this particular function is illustrated as a white triangle at the respective array crosspoints. FIG. 5 shows in the same manner as outlined above the input signals and personalization symbols for the two other functions, full adder, and decoder, which have been selected as illustrating application examples. They will be explained in more detail later.

The horizontal lines connecting AND array 1 with OR array 2 correspond to the product term lines. Finally the vertical sum term lines in OR array 2 provide the respective output or result signals for the particular functions FKT1, FKT2 and FKT3.

Table 4 below shows the logic conditions which apply for control signals S1 to S4 in order to produce each of the three PLA functions chosen as examples.

TABLE 4

| S1 (= S3) | S2 (= S4) | PLA Function        |
|-----------|-----------|---------------------|
| 1         | 0         | FKT1: Two's Complement |
| 0         | 0         | FKT2: Full Adder    |
| 0         | 1         | FKT3: Decoder       |

In more detail, the logic combinations for the three chosen PLA functions FKT1, FKT2 and FKT3 are as follows:

(FKT1) Two's Complement of a Three-Digit Binary Number

Input: A0, A1, A2
Output: A0K, A1K, A2K $A2K = \overline{A0}\,\overline{A1}\,A2 + \overline{A0}\,A1\,A2 + A0\,\overline{A1}\,A2 + A0\,A1\,\overline{A2}$
$A1K = \overline{A0}\,\overline{A1}\,A2 + \overline{A0}\,A1\,\overline{A2} + A0\,\overline{A1}\,A2 + A0\,A1\,\overline{A2}$
$A0K = A0\,\overline{A1}\,\overline{A2} + \overline{A0}\,A1\,A2 + \overline{A0}\,\overline{A1}\,A2 + \overline{A0}\,A1\,\overline{A2}$

(FKT2) 2-Bit Full Adder

Input: A0, B0, Carry-in (CIN)
Output: SUM; Carry-out (COU) $SUM = A \oplus B \oplus C = \overline{AB}C + \overline{A}B\overline{C} + A\overline{B}\overline{C} + ABC$     $COU = C(A \oplus B) + AB = \overline{A}BC + A\overline{B}C + AB\overline{C} + ABC$
$\oplus$ = Exclusive OR

(FKT3) 2-Bit Decoder

Input: A0, B0
Output: 0, 1, 2, 3

The disclosed programmable logic array can be elegantly tested by selecting the activatable Don't Care positions in a double-addressing PLA on the basis of the following test principles:

(1) Establishing an unique assignment of the first or second function (first or second personalization plane) of AND array 1 to the test function (Don't Care plane) of OR array 2 for the testing of AND array 1.

(2) Establishing an unique assignment of the first or second function of OR array 2 to the test function of AND array 1 for testing OR array 2.

In this manner, each product term (output line of AND array) or sum term (output line of OR array) is tested through the selection of the activatable Don't Care positions in a double-addressing PLA.

While the invention has been particularly shown and described with reference to the preferred embodiments thereof, it will be understood by those skilled in the art that various changes in form and detail may be made therein without departing from the spirit and scope of the invention.

What is claimed is:

1. A programmable logic array (PLA) for executing different selectable logic functions determined by corresponding personalization patterns comprising:
   a first matrix arrangement forming an AND array having inputs and outputs;
   a second matrix arrangement forming an OR array and having inputs coupled to the outputs of said AND array and whose outputs provide the PLA's outputs, the AND and OR array each including a plurality of input and output lines forming crosspoints as well as a plurality of control lines for the activation of a respective one of the selectable logic functions;
   coupling elements provided at said crosspoints which depending on their individual personalization selectively provide an electrically conductive path at any one or more crosspoints, said coupling elements being individually formed of a respective field effect transistor having at least two adjacent gas sections associated therewith, the source-drain circuit path of each of said transistor becoming conductive under the condition that a turn-on switching potential is applied to said respectively associated at least two gate sections;
   first input control circuits associated with said AND array for providing signals to the inputs of said AND array;
   second input control circuits associated with said OR array and responsive to outputs of said AND array for providing signals to inputs of said OR array, said first and second control circuits being adapted to activate coupling elements at crosspoints not being used for a particular function for providing electrically conductive paths while at the same time inactivating the coupling elements formerly used in effecting functional cross-points for disconnecting previously provided electrically conductive paths.

2. The programmable logic array of claim 1 wherein said first and second control circuits each consist of two-stage AND-OR circuits integrated in said AND and OR array, respectively.

3. The programmable logic array of claims 1 or 2 wherein each of said first control circuits is adapted to perform the following logic functions:

$$Fv' = Fv \cdot \overline{S2}$$

$$Cv = Fv \cdot S2 + \overline{S2} \cdot S1$$

$$Cv' = Fv \cdot S2 + \overline{S2} \cdot \overline{S1} \quad (v = 0, 1, 2 \ldots n),$$

wherein
   Fv is the functional input applied to said each first input control circuit;
   Fv' is the (modified) functional input supplied by each respective first input control circuit to the AND array;
   S1, S2 are internal control signals of the first input control circuits associated with the AND array, and
   Cv, Cv' are the (modified) control signals supplied by each respective first input control circuits to the AND array for controlling the gates associated to FETs constituting coupling elements of said AND array 4. The programmable logic array of claim 3 wherein said first and second control circuits further include output inverter stages to provide a respectively associated array with true and complement input signals.

5. The programmable logic array of claims 1, 2 or 4 further including means for connecting each functional input to be applied to the AND and OR array, respectively, to any discretionary physical input line of the respective array(s).

6. The programmable logic array of claim 5 further composing a wiring pattern adapted to interconnect any one of a plurality of functional inputs to a selected one of the input lines of said AND and OR array.

7. The programmable logic array of claims 1, 2, 4 or 6 wherein said PLA is a double-addressing PLA comprising a personalization pattern representing three selectable functions structured such that for singularly executing a selected one of three selectable functions one of the two gate sections of the FET utilized for effecting said selected function is connected to the control line provided for selection of said selected function, while the remaining gate section of said FET utilized for effecting said selected function is connected to an associated input line, for jointly executing two functions, both gate sections of the respective FETs utilized for effecting said respective two functions are connected to their respective input line, and for executing a third selectable function both gate sections of the FET used for effecting said selected function are connected to the corresponding control lines.

8. The programmable logic array of claim 7 further comprising an additional control line integrated in the OR array for providing control logic for the entire OR array by means of a single control circuit consisting of two logic AND circuits.

9. The programmable logic array of claim 8 wherein said second control circuits being internally controlled by said internal control signals of the first control circuits provide an operational code of instructions as a function of said two internal control signals of the first input control circuits thereby generating three different output states.

10. The programmable logic array of claim 9 further comprising connecting means connecting the outputs of the AND array to the Don't Care positions of the OR array for testing the AND array and the outputs of the OR array to the Don't Care positions of the AND array for testing of the OR array.

11. The programmable logic array of claim 10 wherein the plane including the Don't Care positions of the OR array represents the test plane for the AND array, and the plane including the Don't Care positions of the AND array represents the test plane for the OR array.

* * * * *

UNITED STATES PATENT AND TRADEMARK OFFICE
CERTIFICATE OF CORRECTION

PATENT NO. : 4,468,735
DATED : August 28, 1984
INVENTOR(S) : Volkmar Goetz and Gunther Potz It is certified that error appears in the above-identified patent and that said Letters Patent is hereby corrected as shown below:

Column 7, line 53      "gas" should be --gate--.
(Claim 1)

Signed and Sealed this

Second Day of September 1986

[SEAL]

Attest:

*Attesting Officer*

DONALD J. QUIGG

*Commissioner of Patents and Trademarks*